US010261590B2

(12) United States Patent
Lee et al.

(10) Patent No.: US 10,261,590 B2
(45) Date of Patent: Apr. 16, 2019

(54) APPARATUS AND METHOD FOR RECOGNIZING A MOVING DIRECTION OF GESTURE BASED ON DIFFERENCES BETWEEN SENSOR OUTPUT VALUES

(71) Applicant: MagnaChip Semiconductor, Ltd., Cheongju-si (KR)

(72) Inventors: Yong Sup Lee, Cheongju-si (KR); Dae Ho Lim, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 263 days.

(21) Appl. No.: 14/680,702

(22) Filed: Apr. 7, 2015

(65) Prior Publication Data

US 2016/0004319 A1  Jan. 7, 2016

(30) Foreign Application Priority Data

Jul. 4, 2014 (KR) .................... 10-2014-0083945

(51) Int. Cl.
*G06F 3/01* (2006.01)
*G06F 3/03* (2006.01)
(Continued)

(52) U.S. Cl.
CPC ............ *G06F 3/017* (2013.01); *G06F 3/0308* (2013.01); *G06F 3/0421* (2013.01);
(Continued)

(58) Field of Classification Search
CPC ...... G06F 3/017; G06F 3/0304; G06F 3/0308; G06F 3/03548; G06F 3/042;
(Continued)

(56) References Cited

U.S. PATENT DOCUMENTS

2010/0245289 A1* 9/2010 Svajda .................. G06F 3/0421
345/175
2010/0299642 A1* 11/2010 Merrell ................. G06F 3/0325
715/863

(Continued)

FOREIGN PATENT DOCUMENTS

TW  200923748  6/2009
TW  M454051 U1  5/2013

OTHER PUBLICATIONS

Taiwan Office Action dated Aug. 10, 2018 in Taiwan Patent Application No. 104118960 (5 pages in English, 7 pages in Tawianese).

*Primary Examiner* — Keith L Crawley
(74) *Attorney, Agent, or Firm* — NSIP Law

(57) ABSTRACT

An apparatus and method to recognize a moving direction of gesture are provided. A final moving direction of gesture is determined using the number of intersecting points based on output values from one or more sensors disposed in up, down, left, right directions and a code of an accumulated sum. Thus, a moving direction of target (hand) that moves on the sensors is recognized more accurately. The apparatus to recognize a moving direction of a gesture includes first to fourth sensor disposed at a position that is north, south, west, and east from a center; and a controller configured to identify a number of intersecting points based on output values of the first sensor, the second sensor, the third sensor and the fourth sensor and to estimate a moving direction of the gesture according to the number of the intersecting points.

18 Claims, 12 Drawing Sheets

(51) Int. Cl.
   *G06F 3/042* (2006.01)
   *H03K 17/94* (2006.01)
   *H03K 17/96* (2006.01)

(52) U.S. Cl.
   CPC ....... *H03K 17/943* (2013.01); *H03K 17/9629* (2013.01); *H03K 17/9631* (2013.01)

(58) Field of Classification Search
   CPC ................... G06F 3/0421; G06F 3/041; G06F 2203/04101; G06F 2203/04108; G06F 3/044; H03K 17/943; H03K 17/96; H03K 17/9618; H03K 17/9627; H03K 17/9629; H03K 17/9631; H03K 2017/9604; H03K 2017/9602
   See application file for complete search history.

(56) References Cited

U.S. PATENT DOCUMENTS

| | | | |
|---|---|---|---|
| 2012/0280904 A1 | 11/2012 | Skurnik et al. | |
| 2013/0162520 A1* | 6/2013 | Kettle | G06F 3/017 345/156 |
| 2013/0328763 A1 | 12/2013 | Latta et al. | |
| 2014/0035812 A1* | 2/2014 | Skurnik | G06F 3/017 345/156 |
| 2014/0172373 A1* | 6/2014 | Edwards | G06F 3/011 702/189 |
| 2016/0070358 A1* | 3/2016 | Trattler | G06F 3/017 345/175 |
| 2016/0299635 A1* | 10/2016 | Glover | G06F 3/017 |

\* cited by examiner

FIG. 1 – Conventional Art
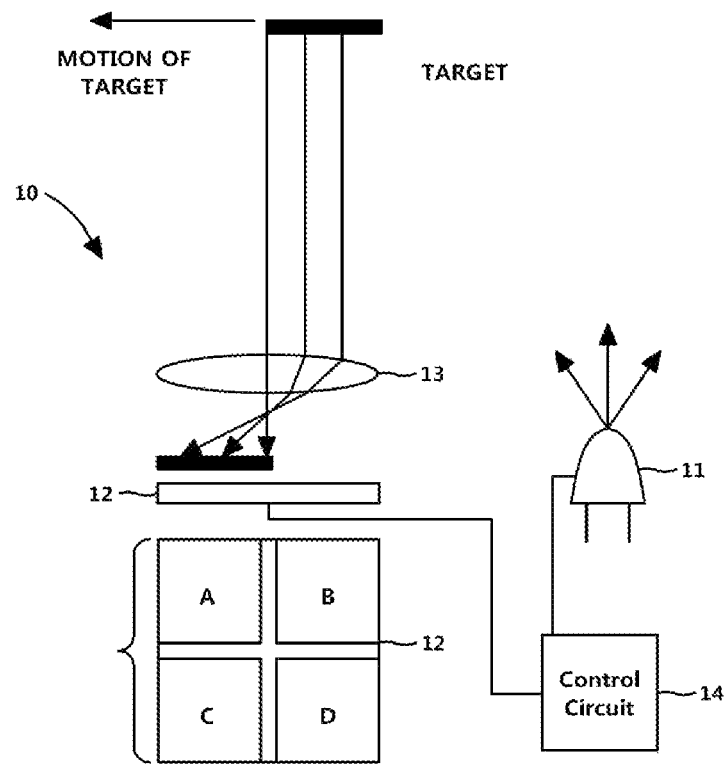
FIG. 2A – Conventional Art
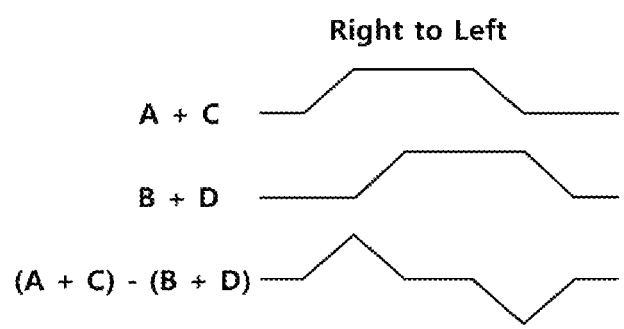

FIG. 2B – Conventional Art
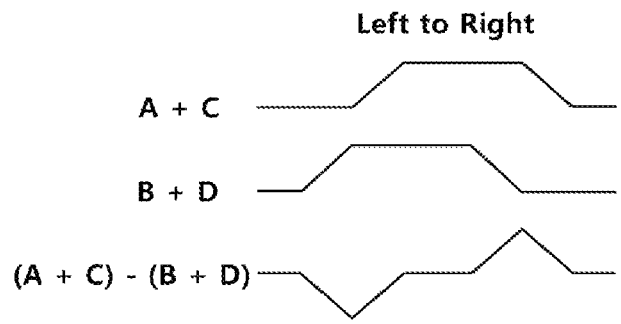
FIG. 2C – Conventional Art
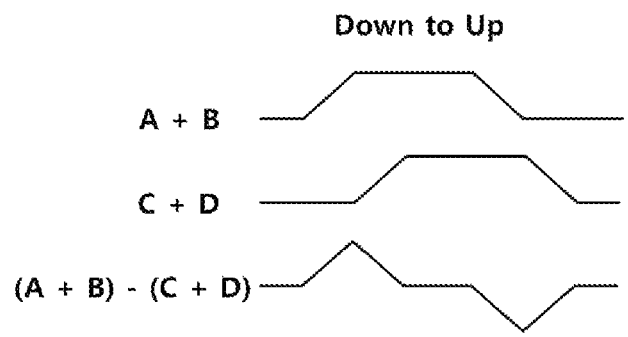
FIG. 2D – Conventional Art
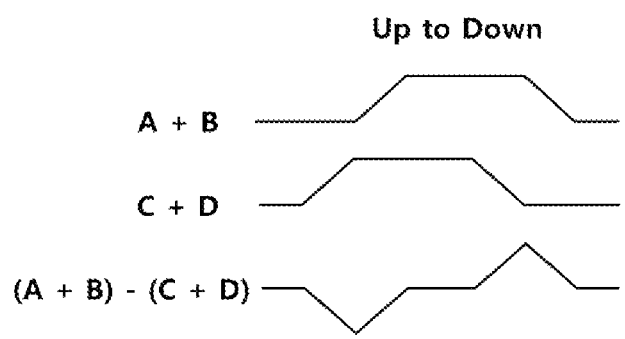

APPARATUS AND METHOD FOR RECOGNIZING A MOVING DIRECTION OF GESTURE BASED ON DIFFERENCES BETWEEN SENSOR OUTPUT VALUES

CROSS-REFERENCE TO RELATED APPLICATIONS

This application claims the benefit under 35 U.S.C. § 119(a) of Korean Patent Application No. 10-2014-0083945 filed on Jul. 4, 2014, in the Korean Intellectual Property Office, the entire disclosure of which is incorporated herein by reference for all purposes.

BACKGROUND

1. Field

The following description relates to a gesture sensor. An apparatus to recognize a moving direction of gesture is configured to use the number of intersection points based on output values of the gesture sensor and data regarding an accumulated sum so that a moving direction of the gesture is determined with greater accuracy.

2. Description of Related Art

A typical apparatus such as a smart device capable of executing various menus and applications without a direct touch other than inputting way of touch manipulation is suggested. This apparatus is such that a gesture sensor is mounted on the smart device to sense infrared light reflected from a palm.

This typical apparatus of recognizing gesture is described with reference to the example of FIG. 1. FIG. 1 illustrates an example of a conventional apparatus of recognizing a moving direction of gesture.

Referring to the example illustrated in FIG. 1, a light emitting diode (LED) 11 provides a light source and a photo sensor unit 12 including four unit photo sensors is provided. Light emitted from the light emitting diode (LED) 11 is reflected as it collides with a palm that moves thereon. The reflected light is delivered to a photo sensor unit 12 via a lens 13.

Then, each unit photo sensor A, B, C, and D of the photo sensor unit 12 determines a moving direction of hand. An order to execute a series of menus or applications on the basis of the moving direction is delivered to a controller.

Here, determining a moving direction by the photo sensor unit 12 is decided only by the difference values (−) between channels. In other words, referring to FIGS. 2A, 2B, 2C, and 2D, output values of each unit photo sensor A, B, C, and D are different from each other based on the moving direction of hand.

FIG. 2A is a diagram illustrating an example in which a user's hand moves from right to left. According to this example, after output values of unit photo sensors A and C increase, output values of sensors B and D increase. Then, after output values of unit photo sensors A and C decrease, output values of sensors B and D decrease. Therefore, output value of (A+C)−(B+D) is obtained as a positive value first and then is obtained as a negative value. On the other hand, FIG. 2B illustrates an example in which a user's hand moves from left to right. Here, as opposed to an example illustrated in FIG. 2A, output value of (A+C)−(B+D) is obtained as a negative value and then is obtained as a positive value.

In some examples, a user's hand moves upward or downward. FIG. 2C is an example illustrating a user's hand moving from down to up. Here, after output values of unit photo sensors A and B increase, output values of sensors C and D increase. Then, after output values of unit photo sensors A and B decrease, output values of sensors C and D decrease. Therefore, output value of (A+B)−(C+D) is obtained as a positive value first and is then obtained as a negative value. On the other hand, FIG. 2D is an example illustrating a user's hand moving from up to down. Here, as opposed to the example of FIG. 2C, output value of (A+B)−(C+D) is obtained as a negative value, and then is obtained as a positive value.

As discussed, the conventional device determines a moving direction of the user's hand by using output values (A+C)−(B+D) and (A+B)−(C+D) on the basis of a combination of unit photo sensors. Based on the difference values (−) of each unit photo sensor that reacts when the user's hand is moving, a moving direction of the hand is determined.

According to the example of FIG. 1, if an output value of each unit photo sensor is distorted due to output deviation or external noise of each unit photo sensor, the accuracy of the final output values is reduced.

As a result, a moving direction of the user's hand cannot be recognized accurately, and errors may potentially occur regarding the order of operation or function of the user's request.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An apparatus for recognizing a moving direction of gesture that is resistant to a deviation on the process with respect to one or more sensors configured to recognize a gesture motion or to external noise and a recognizing method are described. Thus, a smart device is able to more accurately recognize a moving direction of gesture.

In a general aspect, there is provided an apparatus to recognize a moving direction of a gesture including first to fourth sensor disposed at a position that is north, south, west, and east from a center, and a controller configured to identify a number of intersecting points based on output values of the first sensor, the second sensor, the third sensor and the fourth sensor and to estimate a moving direction of the gesture according to the number of the intersecting points.

The controller may be further configured to estimate the moving direction, in response to the number of intersecting points being different.

The controller maybe further configured to estimate the moving direction of the gesture based on estimating a moving of the gesture on the first sensor and the second sensor in a horizontal direction and a moving of the gesture on the third sensor and the fourth sensor in a vertical direction.

The controller may be further configured to determine a final moving direction of the gesture using a code of an accumulated sum based on the difference values (−) of the output values of the first sensor and the second sensor, and the difference values (−) of the output values of the third sensor and the fourth sensor.

The controller may be further configured to determine the final moving direction based on a moving direction from the first sensor to the second sensor, a moving direction from the second sensor to the first sensor, a moving direction from the third sensor to the fourth sensor, and a moving direction from the fourth sensor to the third sensor.

In response to the number of the intersecting points being the same, the controller may be further configured: to estimate a moving direction of the gesture according to an absolute value of an accumulated sum based on the difference values (−) of the output values of the first sensor and the second sensor and the difference values (−) of the output values of the third sensor and the fourth sensor, and to determines a final moving direction of the gesture using a code of the accumulated sum.

A weight may be applied to the accumulated sum, and the weight for the gesture near the first to fourth sensors is different from the weight for the gesture at the center.

The weight for the gesture near the first to fourth sensors may be higher than the weight for the gesture at the center.

The weight may be calculated according to the following equation: ((channel 1−channel 2)×α)/(a larger value between channel 1 and channel 2), ((channel 3−channel 4)×α)/(a larger value between channel 3 and channel 4), where the α is a weight coefficient provided to adjust the weight.

In another general aspect, there is provided a method of recognizing a moving direction of gesture including generating a gesture on a first to fourth sensors, and estimating a moving direction of the gesture according to the number of the intersecting points based on output values of the first sensor, the second sensor, the third sensor, and the fourth sensor.

The method may include determining a final moving direction of the gesture using a code of the accumulated sum based on the difference values (−) of the output values of the first sensor and the second sensor, and the difference values (−) of the output values of the third sensor and the fourth sensor, in response to the number of the intersecting points being different.

The method may include estimating a moving direction of the gesture using an absolute value of an accumulated sum based on the difference values (−) of the output values of the first sensor and the second sensor, and the difference values (−) of the output values of the third sensor and the fourth sensor, in response to the number of the intersecting points being the same, and determining a final moving direction of the gesture is determined by using a code of the accumulated sum.

The accumulated sum may be calculated by applying a weight to the difference values (−) of the first sensor and the second sensor, and to the difference values (−) of the third sensor and the fourth sensor, and adding if an intersecting point is generated based on a change in the difference values (−) where the weight value is applied, all front and back sections of the intersecting point.

The weight may be different with respect to a central portion and a peripheral portion of the sensors.

In another general aspect, there is provided an apparatus to recognize a moving direction of a gesture including first to fourth sensor disposed along a west, east, south, and north edges of a central portion, respectively, and a controller configured: to identify a number of intersecting points based on output values of the first sensor and the second sensor, and output values of the third sensor and the fourth sensor, to estimate a moving direction of the gesture based on the number of the intersecting points, and to determine a final moving direction of the gesture using a code of an accumulated sum based on the difference values (−) of the output values of the first sensor and the second sensor, and the difference values (−) of the output values of the third sensor and the fourth sensor.

A gesture may be determined to have moved from top to bottom of the central portion, in response to the code of the accumulated sum of the difference between the third sensor and the fourth sensor being lesser than zero "0."

A gesture may be determined to have moved from left to right of the central portion, in response to the code of the accumulated sum of the difference between the first sensor and the second sensor being greater than zero "0."

A gesture may be determined to have moved from right to left of the central portion, in response to the code of the accumulated sum of the difference between the first sensor and the second sensor being lesser than zero "0."

A gesture may be determined to have moved from bottom to top of the central portion, in response to the code of the accumulated sum of the difference between the third sensor and the fourth sensor being greater than zero "0."

The output value of the first to fourth sensors is substantially the same when a gesture generating object is placed over the central portion.

The first to fourth sensors are configured to receive light.

As discussed above, the apparatus and method for recognizing moving direction of gesture provide numerous advantageous.

In the present example, four sensors are aligned in a diamond shape, i.e., channel 1, channel 2, channel 3, and channel 4. A moving direction of a target is determined using the number of intersecting points (CH1−CH2) and (CH3−CH4), data regarding an absolute value of accumulated sum, and data regarding a code. Accordingly, it is possible to determine the moving direction more accurately rather than using only the difference values (−) of four sensors aligned as hexahedron as suggested by the conventional art. Further, it is possible to improve the accuracy of the moving direction of target because the output deviation or influence of external noise of sensors can be minimized.

Moreover, an accumulated sum is calculated by a real-time operation with respect to output values from sensors, and a quick determination of moving direction can be made. There is no need to mount an additional storage because output values of sensors need not be stored.

Other features and aspects may be apparent from the following detailed description, the drawings, and the claims.

BRIEF DESCRIPTION OF THE DRAWINGS

FIG. 1 is a diagram illustrating an example of a conventional apparatus of recognizing a moving direction of gesture.

FIGS. 2A, 2B, 2C and 2D are diagrams illustrating examples of output graphs of output values of unit photo sensors A, B, C, and D based on a moving direction of hand in respect of the example illustrated in FIG. 1.

Figure 3:
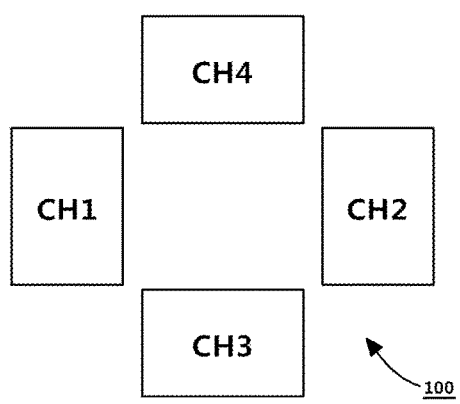
FIG. 3 is a diagram illustrating an example of an alignment of sensors for an apparatus for recognizing a moving direction of gesture.

Throughout the drawings and the detailed description, unless otherwise described, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

FIG. 3 is a diagram illustrating an example of an alignment of sensors for an apparatus for recognizing a moving direction of gesture. The apparatus for recognizing a moving direction of gesture may be mounted on a terminal to sense infrared light reflected from a palm. As a non-exhaustive illustration only, a terminal described herein may refer to mobile devices such as, for example, a cellular phone, a smart phone, a wearable smart device (such as, for example, a ring, a watch, a pair of glasses, glasses-type device, a bracelet, an ankle bracket, a belt, a necklace, an earring, a headband, a helmet, a device embedded in the cloths or the like), a personal computer (PC), a tablet personal computer (tablet), a phablet, a mobile internet device (MID), a personal digital assistant (PDA), an enterprise digital assistant (EDA), a digital camera, a digital video camera, a portable game console, an MP3 player, a portable/personal multimedia player (PMP), a handheld e-book, an ultra mobile personal computer (UMPC), a portable lab-top PC, a global positioning system (GPS) navigation, a personal navigation device or portable navigation device (PND), a handheld game console, an e-book, and devices such as a high definition television (HDTV), an optical disc player, a DVD player, a Blue-ray player, a setup box, robot cleaners, or any other device having a touch screen interface.

In this example, channel 1 (CH1), channel 2 (CH2), channel 3 (CH3), and channel 4 (CH4) are aligned in a diamond shape as independent sensor. Channels 1 and 2 are aligned in a transverse direction, and channels 3 and 4 are aligned in a longitudinal direction. This diamond shape structure is intended to easily detect a position and a moving path by setting output values between each sensor to be different with respect to the target (e.g., the hand of a user) disposed in up, down, left, right directions.

The sensors are configured to recognize a gesture, and a sensor, such as, for example, a photo diode, may be used. A set of channels 1 to 4 is referred to as a sensor unit 100.

Figure 4A:
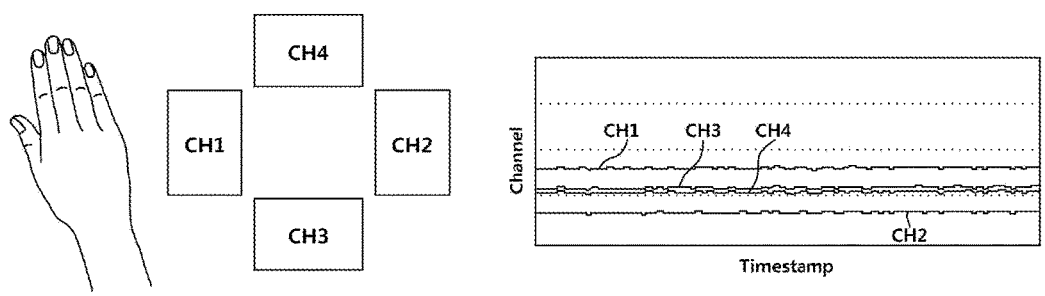
FIGS. 4A, 4B, 4C, and 4D are diagrams illustrating examples in which a target is fixed near channels 1, 2, 3, and 4 in respect of the example illustrated in FIG. 3.
Figure 4B:
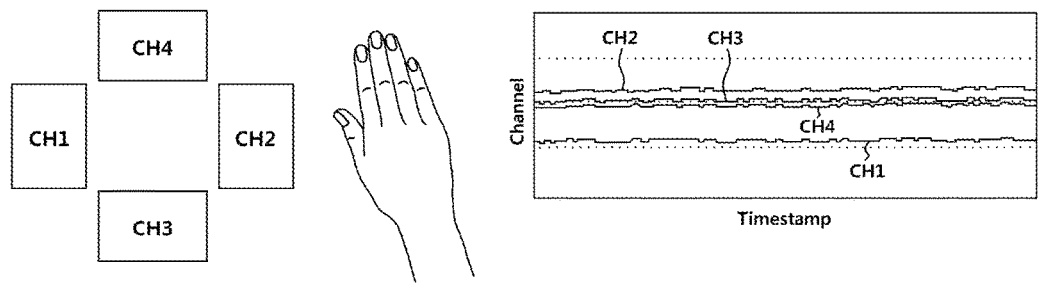
Figure 4C:
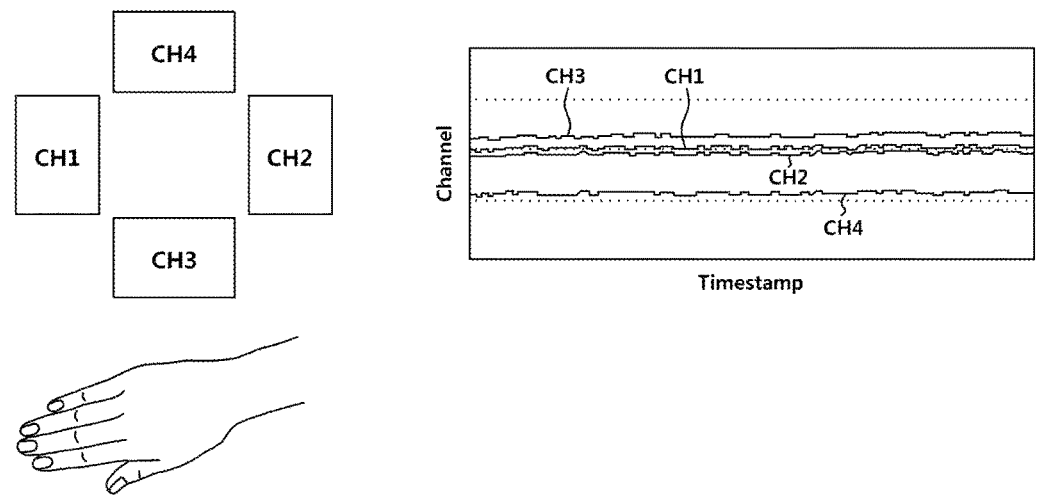
Figure 4D:
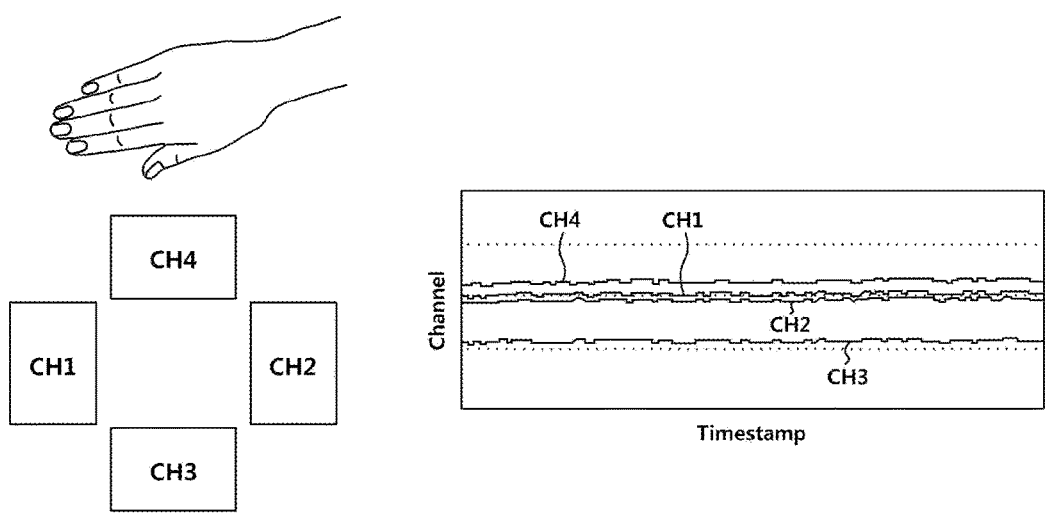

FIG. 4A is a diagram illustrating an example in which a hand is placed to left side of channel 1. Because of the hand's position, channel 1 shows a highest output value and channel 2 shows a lowest output value. Channels 3 and 4 have substantially the same output values, because the hand is positioned at the same position substantially. FIG. 4B is a diagram illustrating an example in which a hand is placed to right side of channel 2. Because of the hand's position, channel 2 shows a highest output value and channel 1 shows a lowest output value. Channels 3 and 4 have substantially the same output values as illustrated in the example of FIG. 4A. FIG. 4C is a diagram illustrating an example in which a hand is placed below channel 3. Because of the hand's position, channel 3 shows a highest output value and channel 4 shows a lowest output value. Channels 1 and 2 have substantially the same output values. FIG. 4D is a diagram illustrating an example in which a hand is placed above channel 4 of sensor unit 100. Because of the hand's position, channel 4 shows a highest output value and channel 3 shows a lowest output value. Channels 1 and 2 have substantially the same output values.

As set forth above, according to a position of the hand, channels 1, 2, 3, and 4 have output values, which may be different from one another.

Figure 5A:
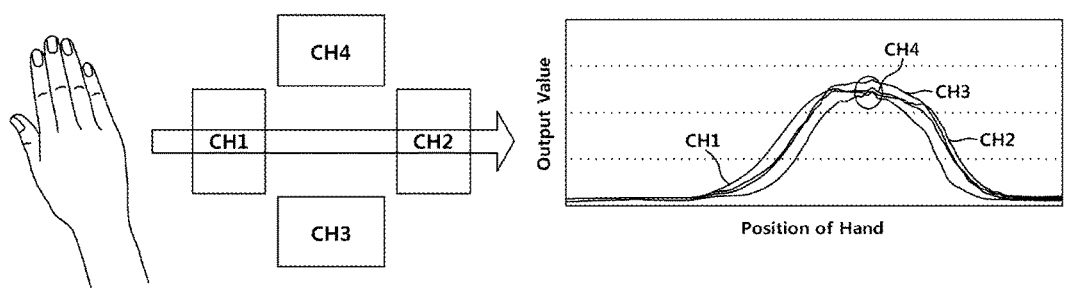
FIGS. 5A, 6A, 7A, and 8A are diagrams illustrating examples of a moving direction of hand and corresponding output values of sensors in respect of the example of FIG. 3.
Figure 5B:
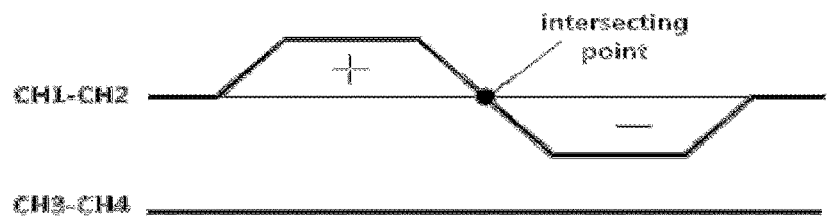
FIGS. 5B, 6B, 7B and 8B are diagrams illustrating an example of a change in difference values (−) of each channel when a hand moves.

FIG. 5A is a diagram illustrating an example in which a hand moves from CH1 towards CH2. According to a moving direction of the hand, an output value of channel 1 increase and then decreases. Then, a high output value of channel 2 is shown. If a hand is positioned at a center of the sensor unit 100, channels 1 to 4 have substantially the same output values. According to the movement of the hand, difference values of (CH1–C2) and (CH3–CH4) are changed as illustrated in the example of FIG. 5B. As illustrated in the example of FIG. 5B, a code of values of (CH1–CH2) changes from positive (+) code to negative (−) code. A code is changed when a hand is positioned at the center of the sensor unit 100, and an intersecting point is generated at this time. However, an output value of (CH3–CH4) is '0' or maintained relatively smaller than the output value of (CH1–CH2). Thus, intersecting point is not generated with respect to (CH3–CH4).

Figure 6A:
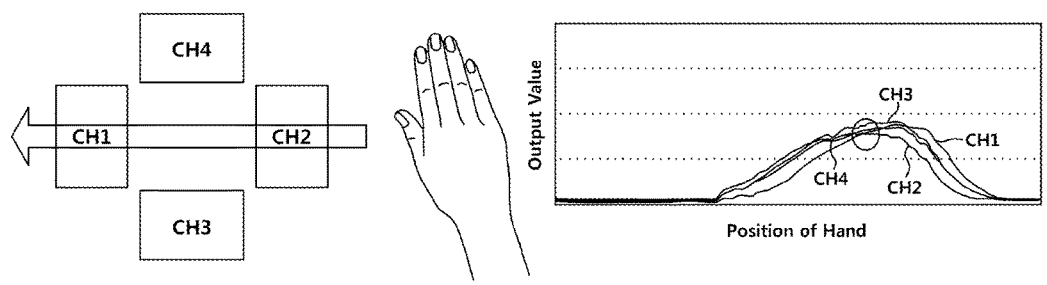
Figure 6B:
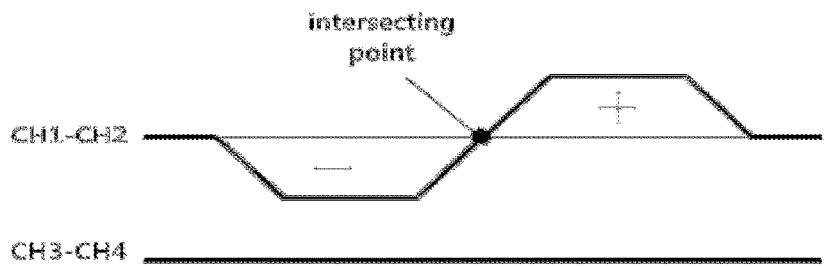

FIG. 6A is a diagram illustrating an example in which a hand moves from channel 2 towards channel 1. According to a moving direction of the hand, an output value of channel 2 increase and then decreases. Then, a high output value of channel 1 is shown. If a hand is positioned at a center of the sensor unit 100, channels 1 to 4 have substantially the same output values. A change in difference values of (CH1–CH2) and (CH3–CH4) in accordance with a motion of the hand is illustrated in the example of FIG. 6B. As illustrated in the example of FIG. 6B, a code of values of (CH1–CH2) changes from negative (−) code to positive (+) code. A code is changed when the hand is positioned at the center of the sensor unit 100, and an intersecting point is generated. However, an output value of (CH3–CH4) is '0' or maintained relatively smaller than the output value of (CH1–CH2). Thus, the intersecting point is not generated with respect to (CH3–CH4).

Figure 7A:
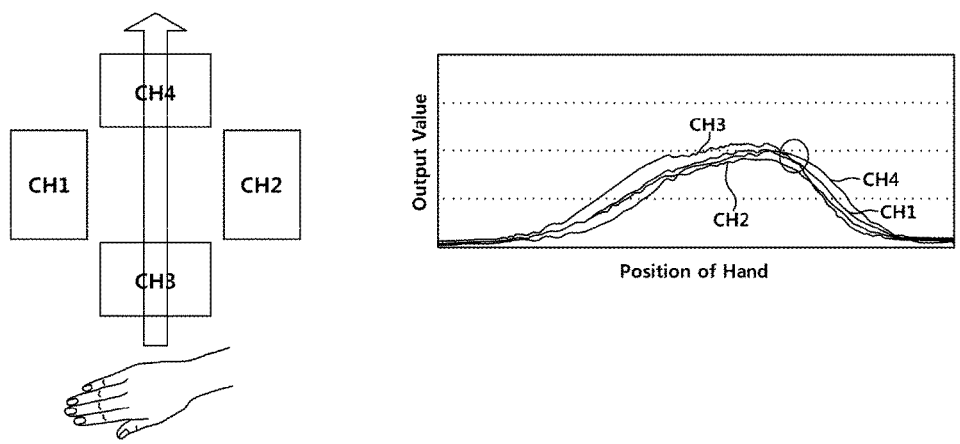
Figure 7B:
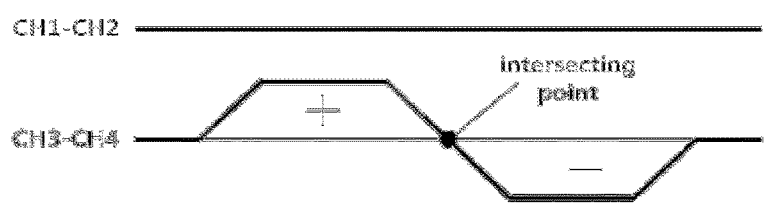

FIG. 7A is a diagram illustrating an example in which a hand moves from CH3 towards CH4. According to a moving direction of the hand, an output value of channel 3 increases and then decreases. Then, a high output value of channel 4 is shown. If a hand is positioned at the center of the sensor unit 100, channels 1 to 4 have substantially the same output values. FIG. 7B illustrates a change in difference values of (CH3−CH4) and (CH1−CH2) in accordance with a motion of the hand, as shown in FIG. 7A. As illustrated in the example of FIG. 7B, a code of values of (CH3−CH4) changes from positive (+) code to negative (−) code. A code is changed when a hand is positioned at the center of the sensor unit 100, and an intersecting point is generated at this time. However, an output value of (CH1−CH2) is '0' or maintained relatively smaller than the output value of (CH3−CH2). Thus, the intersecting point is not generated with respect to (CH1−CH2).

Figure 8A:
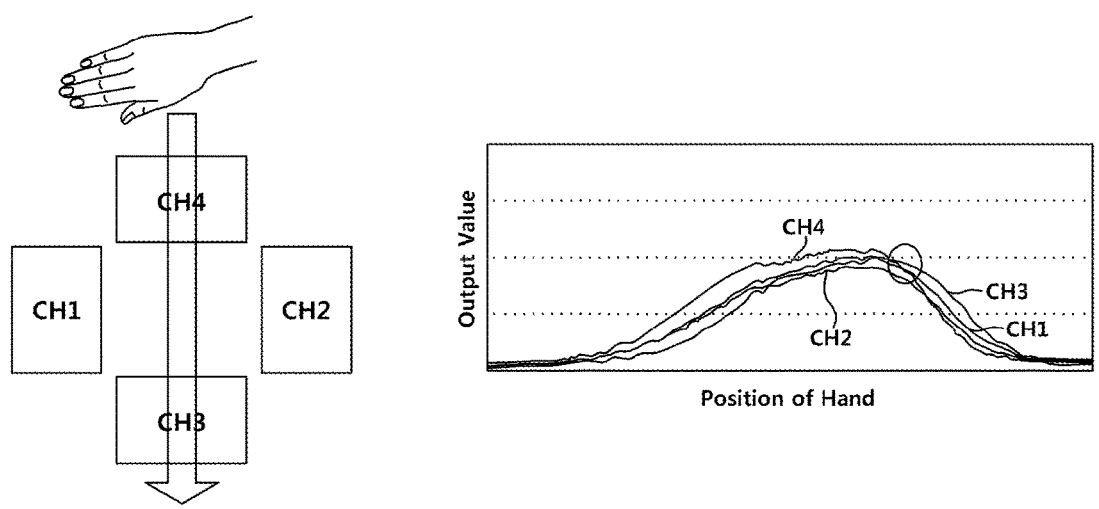
Figure 8B:
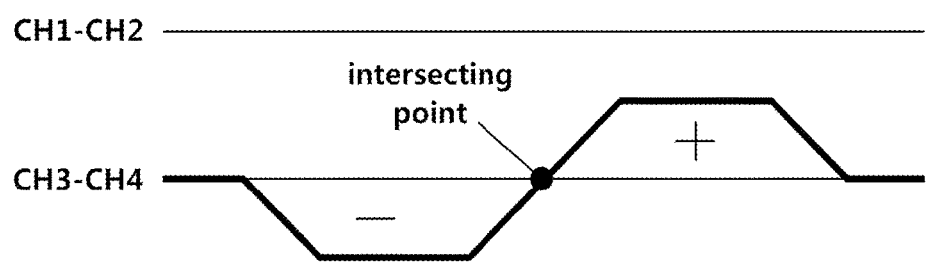

FIG. 8A is a diagram illustrating an example in which a hand moves from channel 4 towards channel 3. According to a moving direction of hand, an output value of channel 4 increases and then decreases. Then, a high output value of channel 3 is shown. If a hand is positioned at a center of the sensor unit 100, channels 1 to 4 have substantially the same output values. A change in difference values of (CH3−CH4) and (CH1−CH2) in accordance with a moving of hand is illustrated in the example of FIG. 8B. As illustrated in the example of FIG. 8B, a code of values of (CH3−CH4) changes from negative (−) code to positive (+) code. When a hand is positioned at the center of the sensor unit 100, a code is changed and the intersecting point is generated at this time. However, an output value of (CH1−CH2) is '0' or maintained relatively smaller than the output value of (CH3−CH2). Thus, the intersecting point is not generated with respect to (CH1−CH2).

Figure 9:
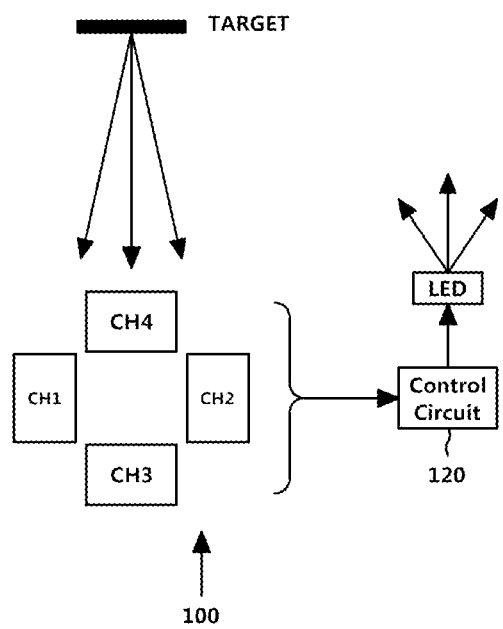
FIG. 9 is a diagram illustrating an example of an apparatus for recognizing a moving direction of gesture.

FIG. 9 is a diagram illustrating an example of an apparatus to recognize a moving direction of gesture. In this example, as discussed above, a sensor unit 100 including channels 1 to 4 and a controller 120 to recognize a moving direction of the hand based on the number of intersecting points between CH1 and CH2 or between CH3 and CH4, which are generated in accordance with a moving of hand and data regarding an accumulated sum. The data regarding the accumulated sum includes data regarding an absolute value and a code.

In this example, the controller 120 estimates a moving direction of the hand using the number of intersecting points generated by the movement of the hand and determines a final moving direction of the hand using data regarding a code of the accumulated sum. The moving direction of the hand is estimated in connection with the hand moving in left, right, up, or down direction. The moving direction of hand is determined to accurately determine a direction such as from left to right, from right to left, from down to up, or from up to down.

A process to determine a moving direction by the apparatus for recognizing moving direction of gesture is discussed with reference to FIG. 10. The operations in FIG. 10 may be performed in the sequence and manner as shown, although the order of some operations may be changed or some of the operations omitted without departing from the spirit and scope of the illustrative examples described. Many of the operations shown in FIG. 10 may be performed in parallel or concurrently. The above description of FIGS. 1-9, is also applicable to FIG. 10, and is incorporated herein by reference. Thus, the above description may not be repeated here.

In S100, an action, such as, a gesture from a user, to execute menus or applications provided in a terminal is detected. Here, the gesture is a motion of the hand in a horizontal or vertical direction with respect to the upper sensor unit 100.

When the gesture is generated, the sensor unit 100 receives light reflected from the hand. Then, output values of each sensor, i.e., channels 1 to 4, included in the sensor unit 100 is delivered to the controller 120. In S110, the controller 120 identifies the number of intersecting points of (CH1−CH2) and (CH3−CH4).

In S120, the controller 120 compares the number of intersecting points for the difference values of (CH1−CH2) with the number of intersecting points for the difference values of (CH3−CH4). If the number of intersecting points (CH1−CH2) is not the same as the number of intersecting points of (CH3−CH4), in S122 to S125, the controller 120 estimates a moving direction of hand. In other words, an estimate is made as to whether the hand moves from left to right or from up to down. A precise moving direction is not obtained at this stage.

To determine a final moving direction of the hand, a code of an accumulated sum of (CH1−CH2) or (CH3−CH4) is used. The code of accumulated sum is obtained using channel data where an intersecting point is an odd number. In S122 to S124, if the number of intersecting points of (CH1−CH2) is an odd number and the number of intersecting points of (CH3−CH4) is an even number, a code of the accumulated sum of (CH1−CH2) is used in S126. If the number of intersection points of (CH1−CH2) is an even number and the number of intersection points of (CH3−CH4) is an odd number, a code of the accumulated sum of (CH3−CH4) is used in S128.

A final moving direction of the hand in accordance with a code of an accumulated sum is determined as described below. If a code of the accumulated sum of (CH1−CH2) is greater than '0' (i.e., +), a hand is determined to have moved from left (CH1) to right (CH2) of the sensor unit 100. If a code of the accumulated sum of (CH1−CH2) is smaller than '0' (i.e., −), a hand is determined to have been moved from right (CH2) to left (CH1). If a code of the accumulated sum of (CH3−CH4) is greater than '0' (i.e., +), a hand is determined to have been moved down (CH3) to up (CH4) in the sensor unit 100. If a code of the accumulated sum of (CH3−CH4) is smaller than '0' (i.e., −), a hand is determined to have been moved up (CH4) to down (CH3).

When the number of intersecting points of (CH1−CH2) and the number of intersecting points of (CH3−CH4) are the same, an absolute value of the accumulated sum of (CH1−CH2) and (CH3−CH4) is used. When the number of intersecting points is the same, the number of intersecting points of (CH1−CH2) and the number of intersecting points of (CH3−CH4) may be an odd number, or the number of intersecting points of (CH1−CH2) and the number of intersecting points of (CH3−CH4) may be an even number. The even number of intersecting points includes the number of intersecting points being '0'(zero).

When using an absolute value of the accumulated value, In S130, an absolute value of an accumulated sum of (CH1−CH2) and an absolute value of an accumulated sum of (CH3−CH4) are compared. A controller 120 estimates a moving direction of hand according to the comparison of the absolute value of the accumulated sum. An estimate is made as to whether the hand moves from left to right or from up to down. Referring to the results of the comparison, a final moving direction is determined by using a code of an accumulated sum of which an absolute value is larger than the others. In S126, when an absolute value of an accumulated sum of (CH1−CH2) is larger than that of (CH3−CH4), a moving direction is determined based on a code of the accumulated sum of (CH1−CH2). The determination of moving direction in accordance with the step S126 is discussed above. In S128, when an absolute value of an accumulated sum of (CH1−CH2) is smaller than that of (CH3−CH4), a moving direction is determined based on a code of the accumulated sum of (CH3−CH4). The determination of moving direction in accordance with the step S128 is discussed above.

Figure 10:
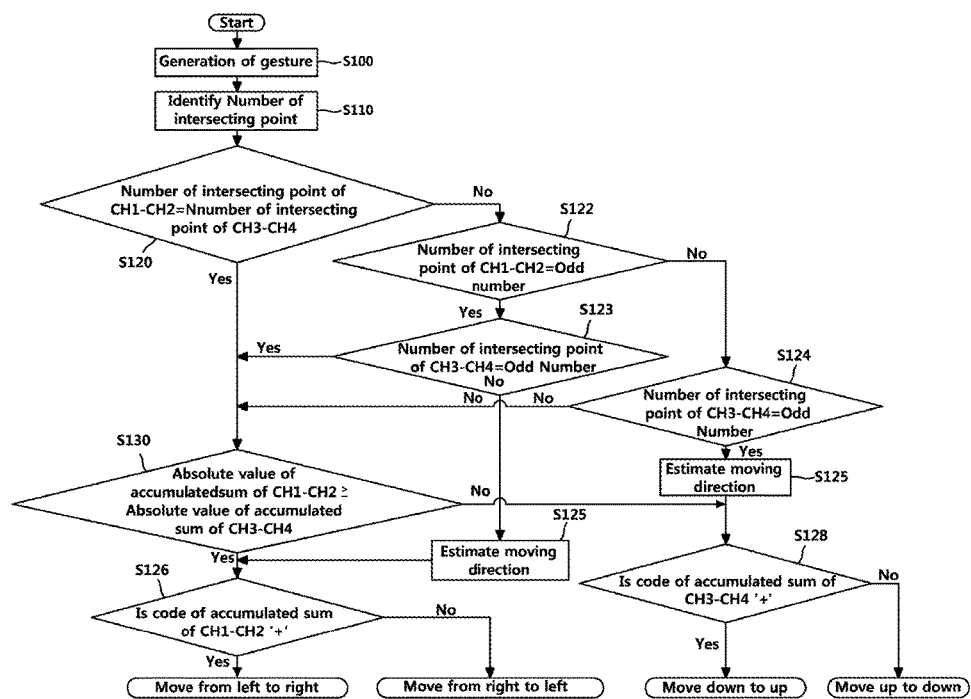
FIG. 10 is a diagram illustrating an example of a method for recognizing a moving direction of gesture.

As set forth above, a moving direction of the hand is determined by using the number of intersecting points and a code of the accumulated sum as illustrated in the example of FIG. 10. Table 1, below shows such a scenario.

An example of a method of applying the weight value is expressed according to the following Equation (1) and Equation (2).

$$((CH1-CH2) \times \alpha)/(\text{a larger value from between CH1 and CH2}) \quad \text{Equation (1):}$$

$$((CH3-CH4) \times \alpha)/(\text{a larger value from between CH3 and CH4}) \quad \text{Equation (2):}$$

$\alpha$ is a weight coefficient provided to adjust a weight of the weight value. The weight coefficient may be selected in accordance with a magnitude of the difference values.

After the weight value is applied, in S230, a code of an interval value between intersecting points is determined. Determination of code is described with reference to FIGS. 12A and 12B.

TABLE 1

| Intersecting point of CH1-CH2 | | Intersecting point of CH3-CH4 | | Estimate of moving direction | Determination of final moving direction |
|---|---|---|---|---|---|
| Odd number | Even number | Odd number | Even number | | |
| ○ | X | X | ○ | Estimate of Left ↔ Right in Horizontal direction | Use code of accumulated, sum |
| ○ | X | ○ | X | Absolute value of accumulated sum | |
| X | ○ | X | ○ | Absolute value of accumulated sum | |
| X | ○ | ○ | X | Estimate of Top ↔ bottom in Perpendicular direction | |

Figure 11:
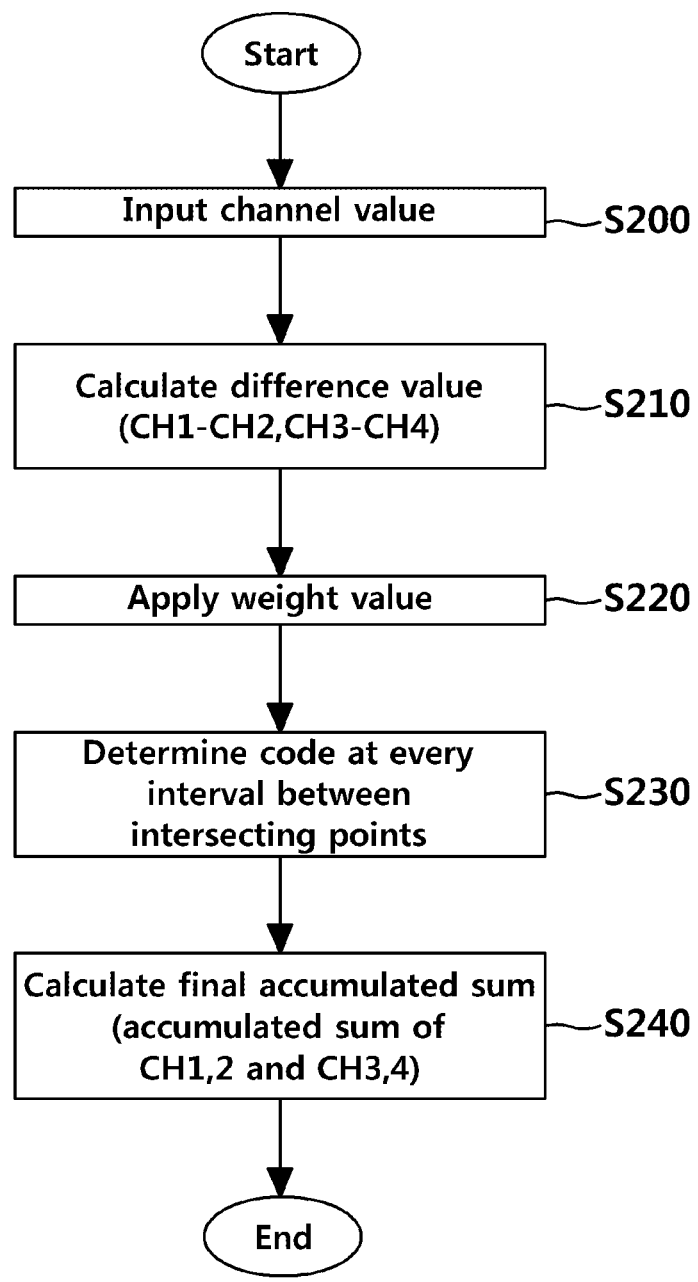
FIG. 11 is a diagram illustrating of an example of a method of calculating a final accumulated sum between channels in respect of the example of FIG. 10.

FIG. 11 is a diagram illustrating of an example of a flow chart of a method of calculating an accumulated sum based on difference values (−) between channels. A process of calculating an accumulated sum in respect of the example of FIG. 10 is illustrated. The operations in FIG. 11 may be performed in the sequence and manner as shown, although the order of some operations may be changed or some of the operations omitted without departing from the spirit and scope of the illustrative examples described. Many of the operations shown in FIG. 11 may be performed in parallel or concurrently. The above description of FIGS. 1-10, is also applicable to FIG. 11, and is incorporated herein by reference. Thus, the above description may not be repeated here.

In S200, a controller 120 receives values of channels 1 to 4. In S210, the controller 120 calculates the received difference values (−) of each channel, i.e., values of (CH1−CH2) and values of (CH3−CH4) are calculated.

In S220, a weight value is applied after difference values (−) of (CH1−CH2) and (CH3−CH4) are calculated. The weight value is applied to improve discrimination with respect to the difference values since an intersecting point is not explicit. If a hand is positioned near CH1, CH2, CH3, or CH4, output values of channels are small but a magnitude of difference values is large. If the hand is positioned at the centers of CH1 to CH4, an output value of the channel is large but a magnitude of the difference values is small. This suggests that the discrimination is large if a hand is positioned near CH1, CH2, CH3, and CH4; however, the discrimination is small if a hand is positioned near the central portion of the sensor unit 100. Hence, a higher weight value is applied where the hand is positioned near CH1, CH2, CH3, and CH4 of the sensor unit 100. A relatively lower weight value is applied where the hand is positioned at the center of the sensor unit 100 to improve the discrimination of difference values.

Figure 12A:
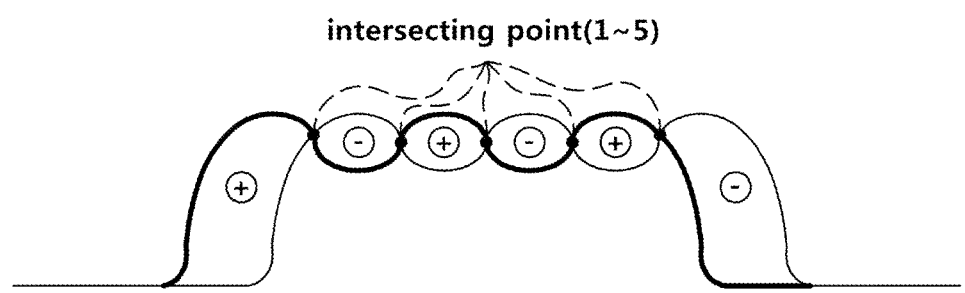
FIGS. 12A and 12B are diagrams illustrating examples of a state of determining a code regarding a value between intersecting points in respect of the example of FIG. 10.
Figure 12B:
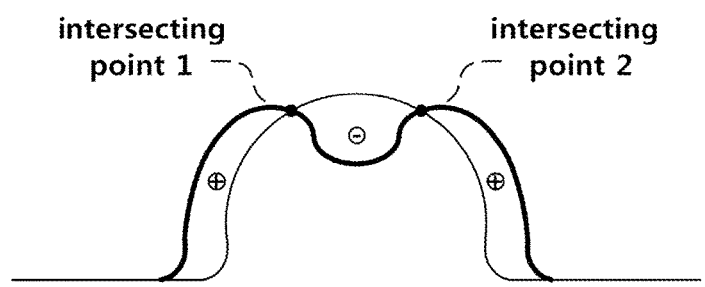

As illustrated in the example of FIG. 12A, the starting point is a positive code (+). When the intersecting point is generated, the positive code (+) is altered to a negative code (−). When the intersecting point is generated, (+) code and (−) code are altered alternately. From the starting point, values applied by the weight value are multiplied by +1 and −1 at every intersecting point. From the starting point prior to a first intersecting point, "a value applied by weight value×(+1)" is allotted and from the first intersecting point prior to a second intersecting point, "a value applied by weight value×(−1)" is allotted. For example, from the second intersecting point prior to a third intersecting point, "a value applied by weight value×(+1)" is allotted with respect to the determination of the code. As illustrated in the example of FIG. 12B, there may be an instance where intersecting points are generated in an even number. If a hand moves from left to right or up to down, an output value of a channel positioned in a different direction does not occur. At the same time, if a hand moves near a central portion of the sensor unit 100, intersecting points are shown in an even number.

In S240, an accumulated sum is calculated by adding difference values of output values of (CH1−CH2) and (CH3−CH4) by means of an adder (not illustrated). An example of calculating the accumulated sum is as follows.

If a hand moves from left (or down) to right (or up), an initial code is positive +. According to a moving direction of hand, at least one intersecting point is generated and a code is changed accordingly. While a position of hand moves, an output value of CH2 is subtracted from an output value of CH1 by the controller 120.

An accumulated sum is obtained by adding all of the areas generated according to the difference values. On the other hand, if a hand moves from right (or up) to left (or down), an initial code is negative −. According to a moving position of hand, at least one intersecting point is generated and a code is changed accordingly. While a position of hand moves, an output value of CH1 is subtracted from an output value of CH2 by the controller 120. An accumulated sum is obtained by adding all of the areas generated according to the difference values.

Here, the accumulated sum is not stored in an additional storage. The controller 120 calculates it on a real-time basis.

The present disclosure estimates a moving direction of hand based on the number of intersecting points generated between CH1 and CH2, or between CH3 and CH4 when a hand moves in one direction on four sensors that are aligned in a diamond shape. A final moving direction is determined by using a code of an accumulated sum. This example corresponds to a situation in which the number of intersecting points of CH1 and CH2, or CH3 and CH4 is specified as an odd number or an even number. If the number of intersecting points is the same, data regarding an absolute value of the accumulated sum is further used. The present examples are intended to describe examples in which four sensors are aligned in a diamond shape. However, various other configurations of the sensors can be applied where the sensors are arranged in up, down, left, and right directions without departing from the spirit and scope of the illustrative examples described.

e systems, processes, functions, blocks, processing steps, and methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a memory, a processing circuits, logic circuits, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a hardware component may include multiple processors or a processor and a controller. In addition, different processing configurations are possible, such a parallel processors.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus recognizing a moving direction of a gesture, comprising:
   first, second, third, and fourth sensors disposed at positions that are in first, second, third, and fourth directions, respectively, from a center, wherein each of the sensors outputs a value indicating detection of the gesture by the sensor; and
   a controller configured to:
      accumulate a first sum of measures based on differences between output values of the first sensor and the second sensor, and a second sum of measures based on differences between output values of the third sensor and the fourth sensor;
      determine a first total number of intersecting points at which output values of the first sensor and the second sensor are equal, and a second total number of intersecting points at which output values of the third sensor and the fourth sensor are equal;
      determine whether the first total number of intersecting points is equal to the second total number of intersecting points; and
      estimate, in response to the determination of whether the first total number of intersecting points is equal to the second total number of intersecting points, an initial moving direction of the gesture,
   wherein, the first direction is opposite to the second direction, the third direction is opposite to the fourth direction, and the first direction is transverse to the third direction.

2. The apparatus of claim 1, wherein the controller is further configured to estimate the initial moving direction based on whether the first total number of intersecting points is different from the second total number of intersecting points.

3. The apparatus of claim 1, wherein the controller is further configured to estimate the initial moving direction of the gesture according to the first sum to be in the first or second direction, and the moving direction of the gesture according to the second sum to be in the third or fourth direction.

4. The apparatus of claim 2, wherein the controller is further configured to estimate the initial moving direction of the gesture based on whether the first total number of intersecting points is odd, or whether the second total number of intersecting points is odd.

5. The apparatus of claim 4, wherein the controller is further configured to determine a final moving direction using a code of the first sum or a code of the second sum.

6. The apparatus of claim 1, wherein the controller is further configured to, in response to the determination of whether the first total number of intersecting points is equal to the second total number of intersecting points:
compare an absolute value of the first sum and an absolute value of the second sum, and
determine a final moving direction of the gesture using a code of the second sum in response to the absolute value of the second sum being less than the absolute value of the first sum, or using a code of the first sum.

7. The apparatus of claim 1, wherein a weight coefficient is applied to the measures that are based on differences between output values of the first sensor and the second sensor, and applied to the measures that are based on differences between output values of the third sensor and the fourth sensor, and
the weight coefficient for the measures at a position closer to one of the first to fourth sensors than to the other sensors is different from the weight coefficient for the measures at the center of the sensors.

8. The apparatus of claim 7, wherein the weight coefficient for the measures at a position closer to one of the first to fourth sensors than to the other sensors is higher than the weight for the measure at the center of the sensors.

9. The apparatus of claim 8, wherein each of the measures of the first sum is calculated according to a first equation:

((channel 1−channel 2)×α)/(a larger of channel 1 or channel 2), and each of the measures of the second sum is calculated according to a second equation:

((channel 3−channel 4)×α)/(a larger of channel 3 or channel 4), where the α is the weight coefficient provided to adjust the measure, and
wherein:
channel 1 is the output value of the first sensor,
channel 2 is the output value of the second sensor,
channel 3 is the output value of the third sensor,
channel 4 is the output value of the fourth sensor,
channel 1 is not equal to channel 2, and
channel 3 is not equal to channel 4.

10. A method of recognizing a moving direction of a gesture, comprising:
generating output values from each of first, second, third and fourth sensors according to a detected gesture;
accumulating a first sum of measures based on differences between the output values of the first and second sensors, and a second sum of measures based on differences between the output values of the third and fourth sensors;
determining a first total number of intersecting points at which the first sum of measures equal zero and a second total number of intersecting points at which the second sum of measures equal zero;

determining whether the first total number of intersecting points is equal to the second total number of intersecting points; and
estimating, in response to the determination whether the first total number of intersecting points is equal to the second total number of intersecting points, an initial moving direction of the gesture.

11. The method of claim 10, further comprising determining a final moving direction of the gesture using a code of the first sum or a code of the second sum.

12. The method of claim 10, further comprising:
estimating a moving direction of the gesture using an absolute value of, the first sum and an absolute value of the second sum, in response to the determination of whether the first total number of intersecting points is equal to the second total number of intersecting points; and
determining a final moving direction of the gesture by using a code of the first sum or a code of the second sum.

13. The method of claim 12, wherein the first measures are calculated by applying a weight value to the differences between the output values of the first sensor and the second sensor, and the second measures are calculated by applying the weight value to the differences between the output values of the third sensor and the fourth sensor, and in response to an intersecting point of the first measures, changing a polarity of the code of the first sum, and in response to an intersecting point of the second measures, changing a polarity of the code of the second sum, and determining whether a number of polarity changes of each of the first code and the second code is an even number or an odd number.

14. The method of claim 13, wherein the weight values applied to first and second measures at a position central to the sensors is different from a weight value applied to the measures at positions in areas peripheral to the sensors.

15. An apparatus recognizing a moving direction of a gesture, comprising:
first, second, third, and fourth sensors disposed along first, second, third, and fourth edges, respectively, surrounding an area central to the sensors; and
a controller configured to:
accumulate a first sum of measures based on differences between output values of the first sensor and the second sensor, and a second sum of measures based on differences between output values of the third sensor and the fourth sensor;
determine a first total number of intersecting points at which output values of the first sensor and the second sensor are equal, and a second total number of intersecting points at which output values of the third sensor and the fourth sensor are equal;
determine whether the first total number of intersecting points is equal to the second total number of intersecting points;
estimate, in response to the determination of whether the first total number of intersecting points is equal to the second total number of intersecting points, an initial moving direction of the gesture; and
determine a final moving direction of the gesture using a code of the first sum or a code of the second sum of measures, and the initial moving direction of the gesture.

16. The apparatus of claim 15, wherein:
the gesture is determined to have moved in a direction from the first edge toward the second edge, in response to the code of the first sum being positive;

the gesture is determined to have moved in a direction from the right edge toward the left edge, in response to the code of the first sum being negative;

the gesture is determined to have moved in a direction from the third edge toward the fourth edge, in response to the code of the second sum being positive; and the gesture is determined to have moved in a direction from the fourth edge toward the third edge, in response to the code of the second sum being negative.

17. The apparatus of claim 15, wherein the output values of the first to fourth sensors are substantially equal to each other when a gesture generating object is placed over an area central to the sensors.

18. The apparatus of claim 15, wherein the output values of the first to fourth sensors correspond to received light.

* * * * *